(12) United States Patent
Tseng et al.

(10) Patent No.: US 11,657,876 B2
(45) Date of Patent: May 23, 2023

(54) ANALOG CONTENT-ADDRESS MEMORY AND OPERATION METHOD THEREOF

(71) Applicant: MACRONIX INTERNATIONAL CO., LTD., Hsinchu (TW)

(72) Inventors: Po-Hao Tseng, Taichung (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 61 days.

(21) Appl. No.: 17/325,244

(22) Filed: May 20, 2021

(65) Prior Publication Data
US 2022/0375526 A1    Nov. 24, 2022

(51) Int. Cl.
| | |
|---|---|
| *G11C 15/04* | (2006.01) |
| *G11C 16/10* | (2006.01) |
| *G11C 16/26* | (2006.01) |
| *G11C 16/34* | (2006.01) |
| *G11C 16/04* | (2006.01) |

(52) U.S. Cl.
CPC ............ *G11C 16/102* (2013.01); *G11C 15/04* (2013.01); *G11C 16/0433* (2013.01); *G11C 16/26* (2013.01); *G11C 16/3404* (2013.01)

(58) Field of Classification Search
CPC . G11C 15/046; G11C 16/102; G11C 16/0433; G11C 16/26; G11C 16/3404
See application file for complete search history.

(56) References Cited

U.S. PATENT DOCUMENTS

| | | |
|---|---|---|
| 6,317,349 B1 | 11/2001 | Wong |
| 7,567,448 B2 | 7/2009 | Godard et al. |
| 2004/0136217 A1 | 7/2004 | de Sandre |
| 2008/0278986 A1 | 11/2008 | Sarin et al. |
| 2014/0347933 A1* | 11/2014 | Lee .................... G11C 15/04 365/185.17 |
| 2017/0092351 A1 | 3/2017 | Han |
| 2020/0395073 A1 | 12/2020 | Tseng et al. |
| 2021/0057027 A1 | 2/2021 | Louie et al. |

* cited by examiner

*Primary Examiner* — Alfredo Bermudez Lozada
(74) *Attorney, Agent, or Firm* — McClure, Qualey & Rodack, LLP

(57) ABSTRACT

An analog CAM and an operation method thereof are provided. The analog CAM includes a matching line, an analog CAM cell and a sense amplifier. Each of the at least one analog CAM includes a first floating gate device having a N type channel and a second floating gate device having a P type channel. A match range is set through programming the first floating gate device and the second floating gate device. The sense amplifier is connected to the matching line. If an inputting signal is within the match range, a voltage of the matching line is pulled down to be equal to or lower than a predetermined level. The sense amplifier outputs a match result if the voltage of the matching line is pulled down to a predetermined level.

20 Claims, 12 Drawing Sheets

//  ANALOG CONTENT-ADDRESS MEMORY AND OPERATION METHOD THEREOF

TECHNICAL FIELD

The disclosure relates in general to a memory and an operation method thereof, and more particularly to an analog content-address memory and an operation method thereof.

BACKGROUND

Along with the development of the memory technology, a content-addressable memory (CAM) is invented. The CAM is a special type of computer memory used in certain very-high-speed searching applications. The CAM may compare an input search word against all rows of stored words in an array in a highly parallel manner. The CAM supplies a very powerful functionality for many applications, especially in pattern matching and search.

Past improvements have been realized by using emerging memristors, such as ReRAM, PCM, CBRAM, FeRAM, to replace the static random-access memory (SRAM) cell in conventional designs, but employ similar schemes based only on binary or ternary states for storage and search.

SUMMARY

The disclosure is directed to an analog content-address memory (CAM) and an operation method thereof. In the analog CAM, floating gate devices are used for storing analog data and any of the analog data matched with inputting signals can be found out.

According to one embodiment, an analog content-address memory (analog CAM) is provided. The analog CAM includes at least one matching line, at least one analog CAM cell and at least one sense amplifier. Each of the at least one analog CAM includes a first floating gate device and a second floating gate device. The first floating date device has a N type channel. The first floating gate device is connected to the matching line. The second floating gate device has a P type channel. The first floating gate device and the second floating gate device are connected in series. A match range is set through programming the first floating gate device and the second floating gate device. The first floating gate device and the second floating gate device of the analog CAM cell are configured to receive an inputting signal. The sense amplifier is connected to the matching line. If the inputting signal is within the match range, a voltage of the matching line is pulled down to be equal to or lower than a predetermined level and the sense amplifier outputs a match result.

According to another embodiment, an analog content-address memory (analog CAM) is provided. The analog CAM includes at least one matching line, at least one analog CAM cell and at least one sense amplifier. Each of analog CAM includes a first floating gate device and a second floating gate device. The first floating gate device has a N type channel. The first floating gate device is connected to the matching line. The second floating gate device has a P type channel. The first floating gate device and the second floating gate device are connected in parallel. A match range is set through programming the first floating gate device and the second floating gate device. The first floating gate device and the second floating gate device are configured to receive an inputting signal. The sense amplifier is connected to the matching line. If the inputting signal is within the match range, a voltage of the matching line is pulled down to be equal to or lower than a predetermined level and the sense amplifier outputs a match result.

According to an alternative embodiment, an operation method of an analog content-address memory (analog CAM) is provided. The operation method of the analog CAM includes. A first floating gate device having a N type channel is programmed. A second floating gate device having a P type channel is programmed. The second floating gate device is connected to the first floating gate device in series or in parallel. A match range is set after programming the first floating gate device and the second floating gate device.

Figure 1:
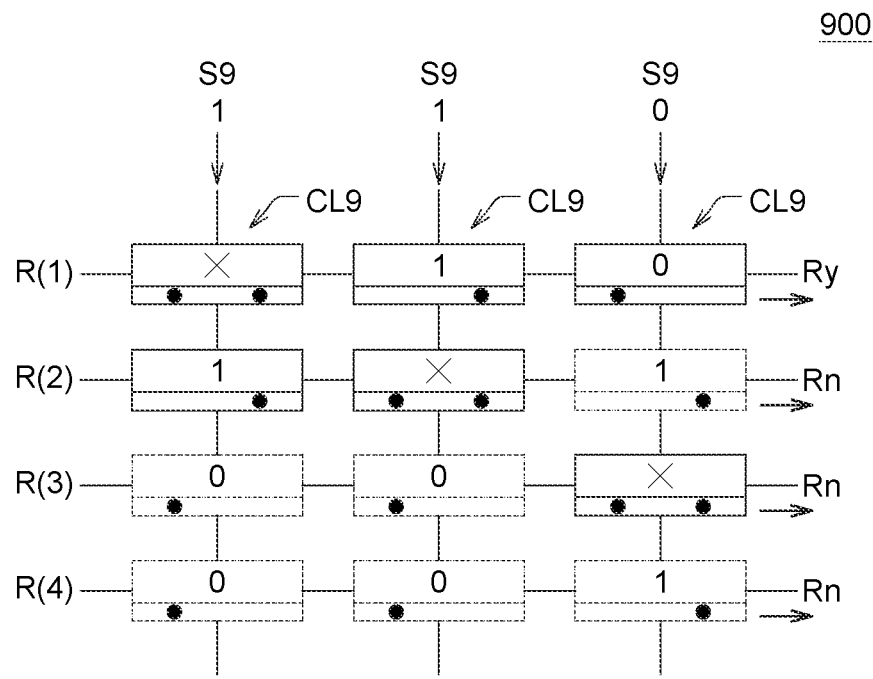
FIG. 1 shows an example of an operation of a digital content-addressable memory (CAM).

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer FIG. 1. FIG. 1 shows an example of an operation of a digital content-addressable memory (CAM)

900. The digital CAM 900 includes a plurality of digital CAM cells CL9. The digital CAM cells CL9 are arranged in several rows R(1), R(2), R(3), R(4) to store a plurality of words. For example, the word stored in the row R(1) is "X, 1, 0." "X" means any value is matched. The word stored in the row R(2) is "1, X, 1." The word stored in the row R(3) is "0, 0, X." The word stored in the row R(4) is "0, 0, 1." A plurality of inputting signals S9 are inputted the digital CAM 900. The first inputting signal S9 is "1", the second inputting signal S9 is "1" and a third inputting signal S9 is "0." The inputting signals S9 are compared with the word stored in the row R(1), and then a match result Ry is outputted. The inputting signals S9 are compared with the word stored in the row R(2), and then a mismatch result Rn is outputted. The inputting signals S9 are compared with the word stored in the row R(3), and then the mismatch result Rn is outputted. The inputting signals S9 are compared with the word stored in the row R(4), and then the mismatch result Rn is outputted. That is to say, the digital CAM 900 may store digital data and any of the digital data matched with the inputting signals S9 can be found out.

Figure 2:
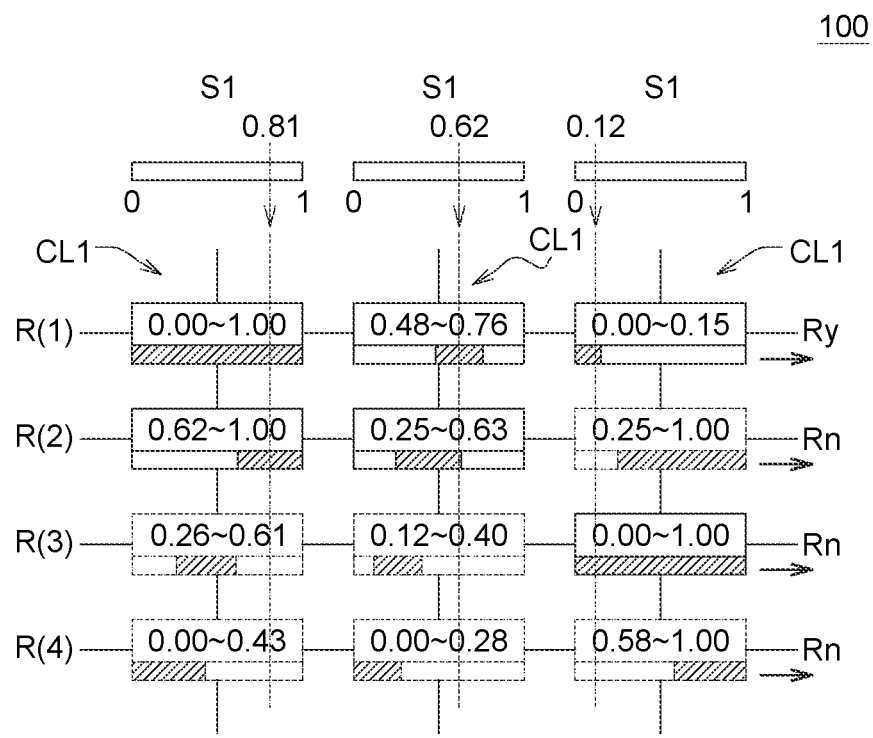
FIG. 2 shows an example of an operation of an analog CAM.

Please refer to FIG. 2, which shows an example of an operation of an analog CAM 100. The analog CAM 100 includes a plurality of analog CAM cells CL1. The analog CAM cells CL1 are arranged in several rows R(1), R(2), R(3), R(4) to store a plurality of words. For example, the word stored in the row R(1) is "0.00-1.00, 0.48-0.76, 0.00-0.15." "0.00-1.00" means any value is matched. The word stored in the row R(2) is "0.62-1.00, 0.25-0.63, 0.25-1.00." The word stored in the row R(3) is "0.26-0.61, 0.12-0.40, 0.00-1.00." The word stored in the row R(4) is "0.00-0.43, 0.00-0.28, 0.58-1.00." A plurality of inputting signals S1 are inputted to the analog CAM 100. The first inputting signal S1 is "0.81", the second inputting signal S1 is "0.62" and the third inputting signal S1 is "0.12."

The inputting signals S1 are compared with the word stored in the row R(1). "0.00-1.00, 0.48-0.76, 0.00-0.15" of the word stored in the row R(1) are match ranges. Because "0.81", "0.62" and "0.12" are respectively within "0.00-1.00", "0.48-0.76" and "0.00-0.15", so the match result Ry is outputted.

The inputting signals S1 are compared with the word stored in the row R(2), and then the mismatch result Rn is outputted. The inputting signals S1 are compared with the word stored in the row R(3), and then the mismatch result Rn is outputted. The inputting signals S1 are compared with the word stored in the row R(4), and then the mismatch result Rn is outputted. That is to say, the analog CAM 100 may store analog data and any of the analog data matched with the inputting signals S1 can be found out.

Figure 3:
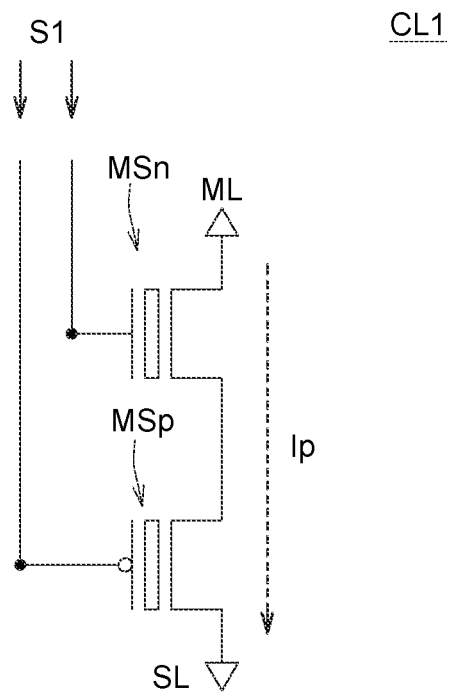
FIG. 3 shows an analog CAM cell according to one embodiment.

Please refer to FIG. 3, which shows the analog CAM cell CL1 according to one embodiment. The analog CAM cell CL1 includes a first floating gate device MSn having a N type channel and a second floating gate device MSp having a P type channel. The second floating gate device MSp is connected to the first floating gate device MSn in series. The first floating gate device MSn is a NMOS, and the second floating gate device MSp is a PMOS. A drain of the first floating gate device MSn is connected to a matching line ML, a source of the first floating gate device MSn is connected to a drain of the second floating gate device MSp. A source of the second floating gate device MSp is connected to a source line SL. The inputting signal S1 is simultaneously inputted into gates of the first floating gate device MSn and the second floating gate device MSp.

Figure 4:
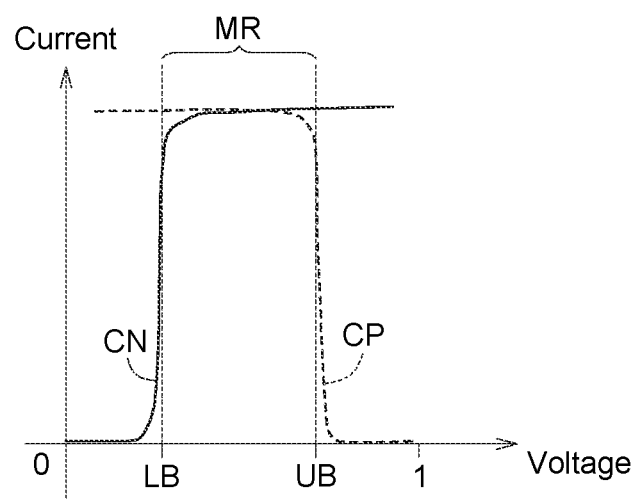
FIG. 4 illustrates a match range of the analog CAM cell in FIG. 3 according to one embodiment.

Refer to FIG. 4, which illustrates a match range MR of the analog CAM cell CL1 according to one embodiment. A curve CN is a characteristic curve of the first floating gate device MSn, and a curve CP is a characteristic curve of the second floating gate device MSp. The steep slope of the curve CN and the curve CP are higher than 0.01 mV/dec. For example, the steep slope of the curve CN and the curve CP in FIG. 4 is 0.015 mV/dec. The first floating gate device MSn and the second floating gate device MSp are super steep slope devices.

In the analog CAM cell CL1, a threshold voltage of the first floating gate device MSn is lower than a threshold voltage of the second floating gate device MSp, so the match range MR is formed between the threshold voltage of the first floating gate device MSn and the threshold voltage of the second floating gate device MSp. In the analog CAM cell CL1, a lower bound LB of the match range MR is the threshold voltage of the first floating gate device MSn, and an upper bound UB of the match range MR is the threshold voltage of the second floating gate device MSp.

As shown in FIG. 3 and FIG. 4, if the inputting signal S1 is within the match range MR, the first floating gate device MSn is turned on and the second floating gate device MSp is turned on. Therefore, a passing current Ip is formed.

If the inputting signal S1 is not within the match range MR, the first floating gate device MSn is off or the second floating gate device MSp is off. Therefore, the passing current Ip is not formed.

Figure 5:
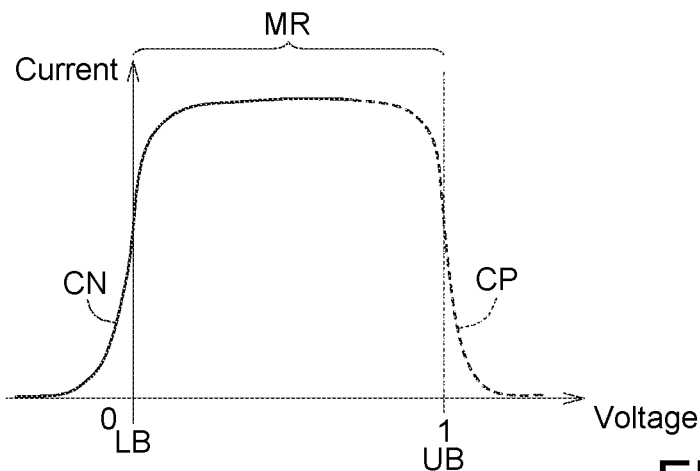
FIGS. 5 to 7 illustrate several examples of the match ranges of the analog CAM cell in FIG. 3.
Figure 6:
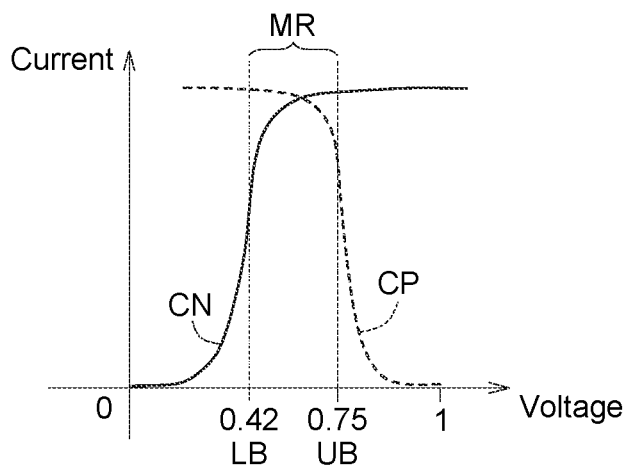
Figure 7:
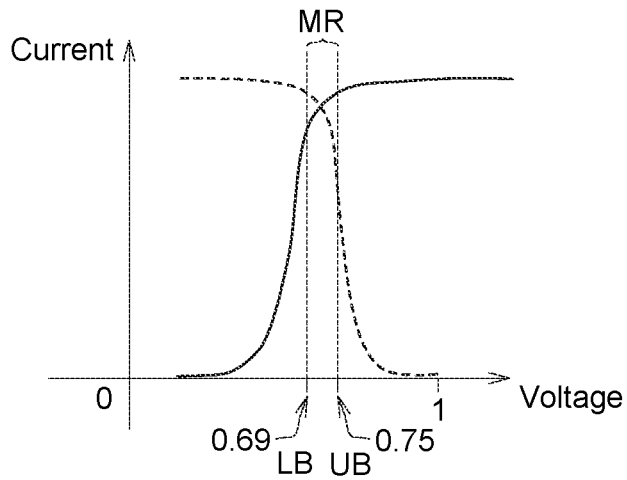

Refer to FIGS. 5 to 7, which illustrate several examples of the match ranges MR of the analog CAM cell CL1. The match range MR in FIG. 5 is "0.00-1.00", the match range MR in FIG. 6 is "0.42-0.75", and the match range MR in FIG. 7 is "0.69-0.75." That is to say, the match range MR of the analog CAM cell CL1 is tunable. The lower bound LB (shown in FIG. 4) of the match range MR is set through the first floating gate device MSn, and the upper bound UB (shown in FIG. 4) of the match range MR is set through the second floating gate device MSp.

Figure 8:
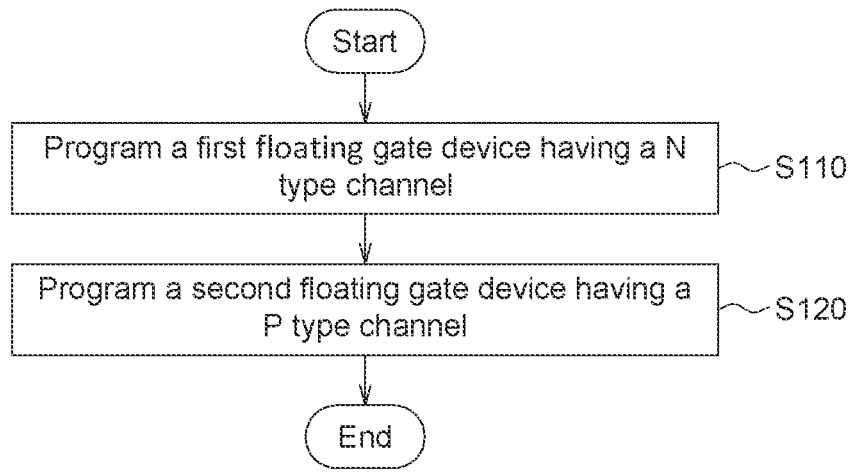
FIG. 8 shows a flowchart of an operation method of the analog CAM for setting the match range.

Refer to FIG. 8, which shows a flowchart of an operation method of the analog CAM 100 for setting the match range MR. The match range MR is set through programming the first floating gate device MSn and the second floating gate device MSp. In step S110, the first floating gate device MSn is programmed. In this step, the first floating gate device MSn is programmed by Fowler-Nordheim (FN) tunneling or Channel Hot Electron (CHE) programming. For example, the gate of the first floating gate device MSn is applied a FN voltage, and the gate of the second floating gate device MSp is applied a pass voltage. After programming the first floating gate device MSn, the lower bound LB (shown in FIG. 4) of the match range MR is defined.

In step S120, the second floating gate device MSp is programmed. In this step, the second floating gate device MSp is programmed by FN tunneling or CHE programming. For example, the gate of the first floating gate device MSn is applied the pass voltage, and the gate of the second floating gate device MSp is applied the FN voltage. After programming the second floating gate device MSp, the upper bound UB (shown in FIG. 4) of the match range MR is defined. The order of the step S110 and the step S120 can be exchanged.

Figure 9:
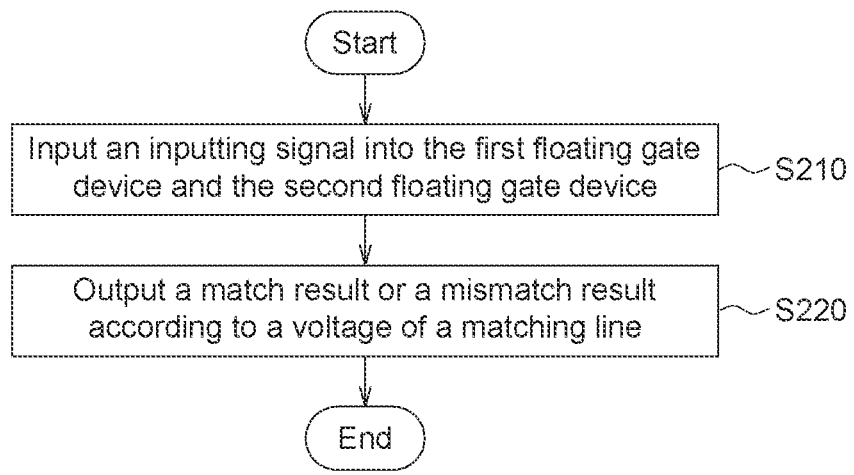
FIG. 9 shows a flowchart of an operation method of the analog CAM for determining whether the inputting signal matches the word.

Refer to FIG. 9, which shows a flowchart of an operation method of the analog CAM 100 for determining whether the inputting signal S1 matches the word. In step S210, the inputting signal S1 is inputted into the first floating gate device MSn and the second floating gate device MSp. In this step, the inputting signal S1 is simultaneously inputted into the gate of the first floating gate device MSn and the gate of the second floating gate device MSp.

In step S220, the match result Ry or the mismatch result Rn is outputted according to the voltage of the matching line ML. For example, if the inputting signal S1 is within the match range MR, then the first floating gate device MSn and the second floating gate device MSp are both turned on and the voltage of the matching line ML will be pulled down. If the inputting signal S1 is not within the match range MR, then the first floating gate device MSn and the second floating gate device MSp are not both turned on and the voltage of the matching line ML will be kept.

Figure 10:
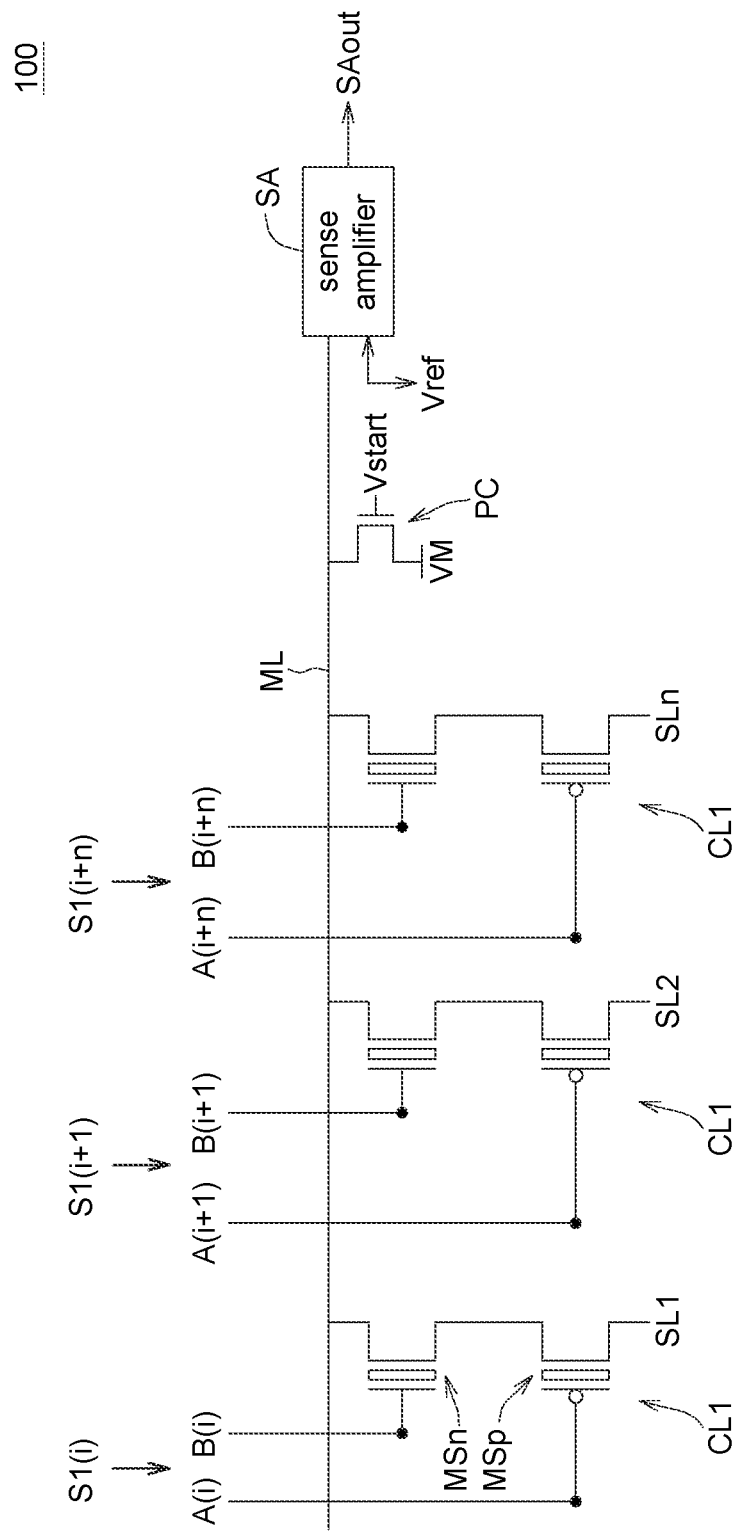
FIG. 10 shows a circuit diagram of the analog CAM according to one embodiment.

Refer to FIG. 10, which shows a circuit diagram of the analog CAM 100 according to one embodiment. The analog CAM 100 may include the matching line ML, a plurality of analog CAM cells CL1, a pre-charge control device PC and a sense amplifier SA. The first floating gate device MSn of each of the analog CAM cells CL1 is connected to the matching line ML. The pre-charge control device PC is connected to the matching line ML. After the precharge control device PC is activated by a start voltage Vstart, the matching line ML is connected to the terminal VM. The sense amplifier SA is connected to the matching line ML and a reference voltage Vref. The sensing circuit SA can compare the voltage of the matching line ML with the reference voltage Vref to output a comparison result SAout.

In FIG. 10, the i-th inputting signal S1($i$) is inputted into the inputting lines A(i) and B(i), the (i+1)-th inputting signal S1($i$+1) is inputted into the inputting lines A(i+1) and B(i+1), and the (i+n)-th inputting signal S1($i$+$n$) is inputted into the inputting lines A(i+n) and B(i+n). If the i-th inputting signal S1($i$) is within the match range MR of the i-th analog CAM cell CL1, the first floating gate device MSn of the i-th analog CAM cell CL1 is turned on and the second floating gate device MSp of the i-th analog CAM cell CL1 is turned on.

Similarly, in FIG. 10, if the (i+1)-th inputting signal S1($i$+1) is within the match range MR of the (i+1)-th analog CAM cell CL1, the first floating gate device MSn of the (i+1)-th analog CAM cell CL1 is turned on and the second floating gate device MSp of the (i+1)-th analog CAM cell CL1 is turned on. If the (i+n)-th inputting signal S1($i$+$n$) is within the match range MR of the (i+n)-th analog CAM cell CL1, the first floating gate device MSn of the (i+n)-th analog CAM cell CL1 is turned on and the second floating gate device MSp of the (i+n)-th analog CAM cell CL1 is turned on.

If the inputting signals S1($i$), S1($i$+1), S1($i$+$n$) are respectively within the match ranges MR of the analog CAM cells CL1, the first floating gate devices MSn of the analog CAM cells CL1 are turned on and the second floating gate devices MSp of the analog CAM cells CL1 are turned on. As such, a voltage of the matching line ML will be pulled down.

Figure 11:
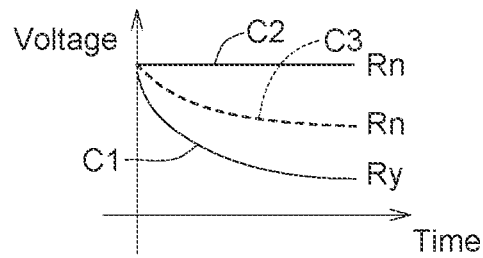
FIG. 11 shows voltage curves of a matching line.

Refer to FIG. 11, which shows voltage curves C1, C2, C3 of the matching line ML. If the inputting signals S1($i$), S1($i$+1), S1($i$+$n$) fully match the word stored in the analog CAM cells CL1 the voltage of the matching line ML will be greatly pulled down to a predetermined level, as shown by the voltage curve C1. Then, the sense amplifier SA outputs the match result Ry according to the voltage of the matching line ML.

If all of the inputting signals S1($i$), S1($i$+1), S1($i$+$n$) do not match the word stored in the analog CAM cells CL1, the voltage of the matching line ML will be kept at an original level, as shown by the voltage curve C2. Then, the sense amplifier SA outputs the mismatch result Rn according to the voltage of the matching line ML.

In one embodiment, if the inputting signals S1($i$), S1($i$+1), S1($i$+$n$) partially match the word stored in the analog CAM cells CL1 the voltage of the matching line ML will be slightly pulled down, as shown by the voltage curve C3. The voltage curve C3 is not below the predetermined level, so the sense amplifier SA outputs the mismatch result Rn according to the voltage of the matching line ML.

Figure 12:
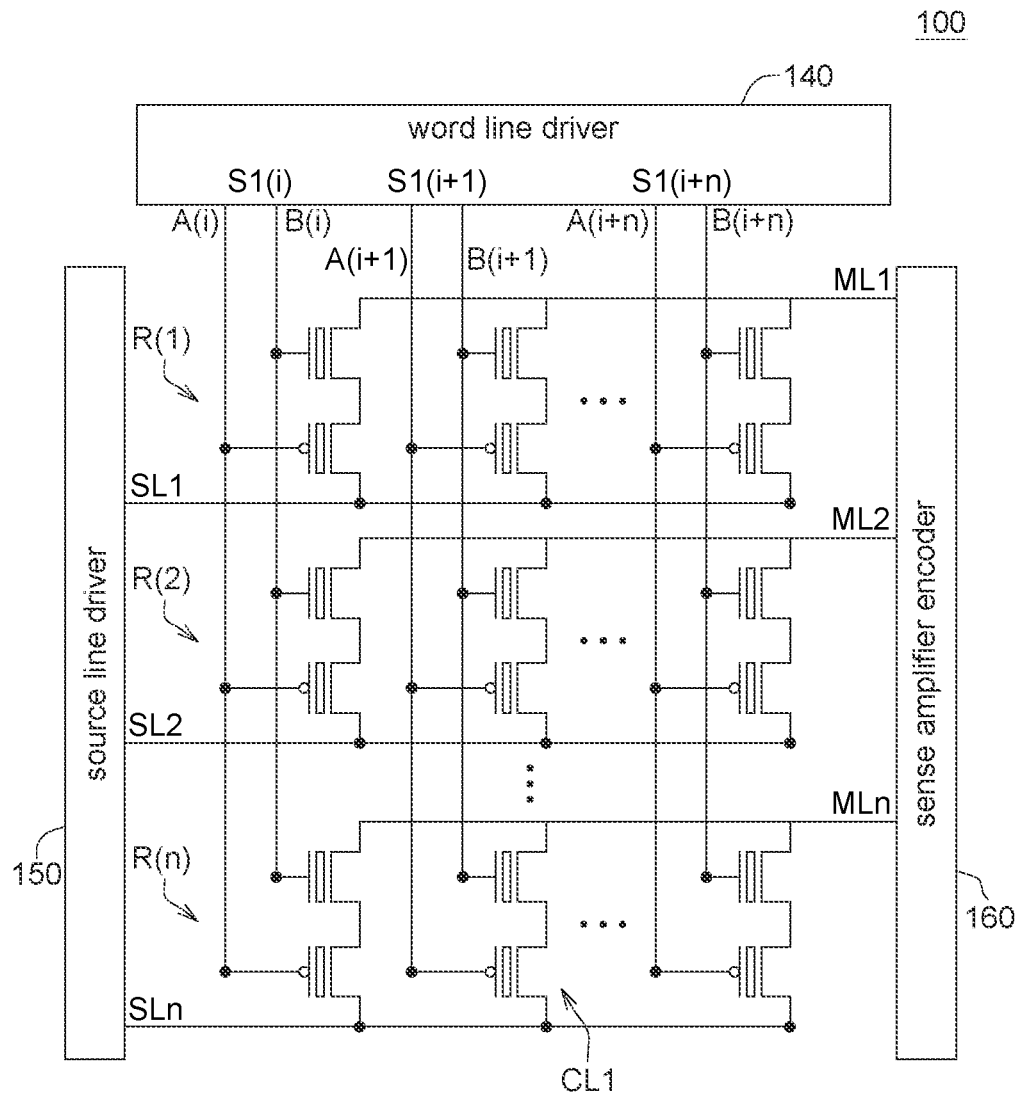
FIG. 12 shows an array structure of the analog CAM according to one embodiment.

Refer to FIG. 12, which shows an array structure of the analog CAM 100 according to one embodiment. In the array structure, the analog CAM 100 further includes a word line driver 140 with search buffer, a source line driver 150 and a sense amplifier encoder 160. The inputting lines A(i), B(i), A(i+1), B(i+1), . . . , A(i+n), B(i+n) are connected to the word line driver 140. The source lines SL1, SL2, . . . , SLn are connected to the source line driver 150. The sense amplifier SA (shown in FIG. 10) is disposed in the sense amplifier encoder 160. The matching lines ML1, ML2, . . . , MLn are connected to the sense amplifier encoder 160.

The analog CAM cells CL1 are arranged in several rows R(1), R(2), . . . , R(n) to store a plurality of different words. The inputting signals S1($i$), S1($i$+1), S1($i$+$n$) are inputting to the analog CAM cells CL1 respectively. The voltage of matching line ML1 will be pulled down or be kept depend on whether the inputting signals S1($i$), S1($i$+1), S1($i$+$n$) match the words stored in the row R(1). Similarly, the voltage of matching line ML2 will be pulled down or be kept depend on whether the inputting signals S1($i$), S1($i$+1), S1($i$+$n$) match the words stored in the row R(2). The voltage of the matching line MLn will be pulled down or be kept depend on whether the inputting signals S1($i$), S1($i$+1), S1($i$+$n$) match the words stored in the row R(n). Then, the sense amplifier encoder 160 obtains which word best matches the inputting signals S1($i$), S1($i$+1), S1($i$+$n$).

Base on above, the analog CAM 100 may store analog data and any of the analog data matched with the inputting signals S1($i$), S1($i$+1), S1($i$+$n$) can be found out.

Figure 13:
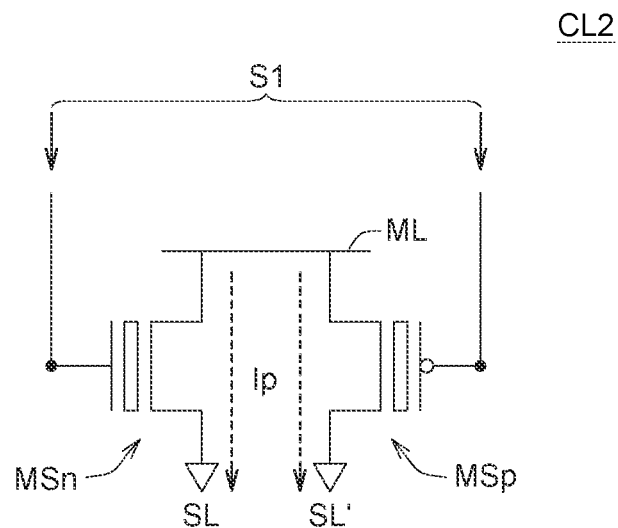
FIG. 13 shows an analog CAM cell according to another embodiment.

In the embodiment described above, the first floating gate device MSn and the second floating gate device MSp are connected in series. In another embodiment, the first floating gate device MSn and the second floating gate device MSp may be connected in parallel. Refer to FIG. 13, which shows an analog CAM cell CL2 according to another embodiment. The analog CAM cell CL2 includes the first floating gate device MSn having the N type channel and the second floating gate device MSp having the F type channel. In the analog CAM cell CL2, the second floating gate device MSp is connected to the first floating gate device MSn in parallel. In the analog CAM cell CL2, the drain of the first floating gate device MSn and the drain of the second floating gate device MSp are connected to the matching line ML, the source of the first floating gate device MSn and the source of the second floating gate device MSp are connected to the source lines SL, SL'. The inputting signal S1 is simultaneously inputted into the gates of the first floating gate device MSn and the second floating gate device MSp.

Figure 14:
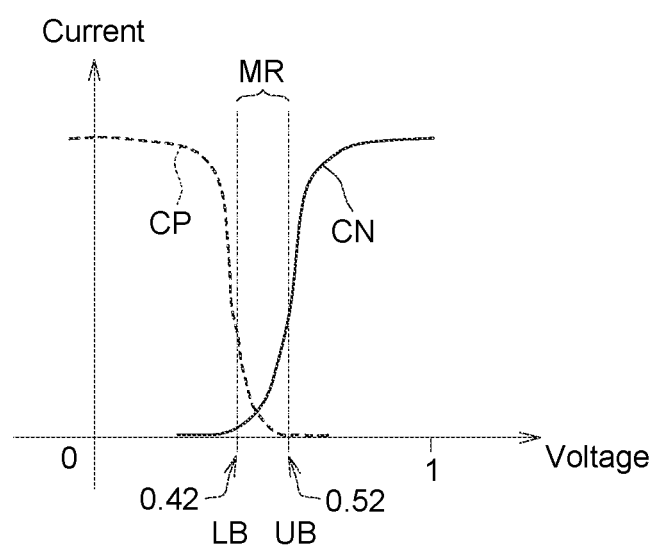
FIG. 14 illustrates a match range of the analog CAM cell in FIG. 13 according to one embodiment.

Refer to FIG. 14, which illustrates the match range MR of the analog CAM cell CL2 according to one embodiment. In the analog CAM cell CL2, the threshold voltage of the first floating gate device MSn is higher than the threshold voltage of the second floating gate device MSp, so the match range MR is formed between the threshold voltage of the first floating gate device MSn and the threshold voltage of the second floating gate device MSp. In the analog CAM cell CL2, the lower bound LB of the match range MR is the threshold voltage of the second floating gate device MSp, and the upper bound UB of the match range MR is the threshold voltage of the first floating gate device MSn.

As shown in FIG. 13 and FIG. 14, if the inputting signal S1 is within the match range MR, the first floating gate device MSn is off and the second floating gate device MSp is off. Therefore, the passing current Ip is not formed.

As shown in FIG. 13 and FIG. 14, if the inputting signal S1 is not within the match range MR, the first floating gate device MSn is turn on or the second floating gate device MSp is turned on. Therefore, the passing current Ip is formed.

Figure 15:
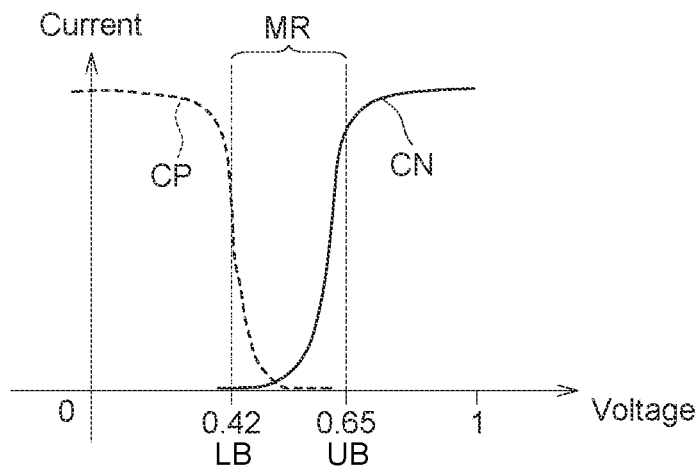
FIGS. 15 to 16 illustrate several examples of the match ranges of the analog CAM cell in FIG. 13 according to one embodiment.
Figure 16:
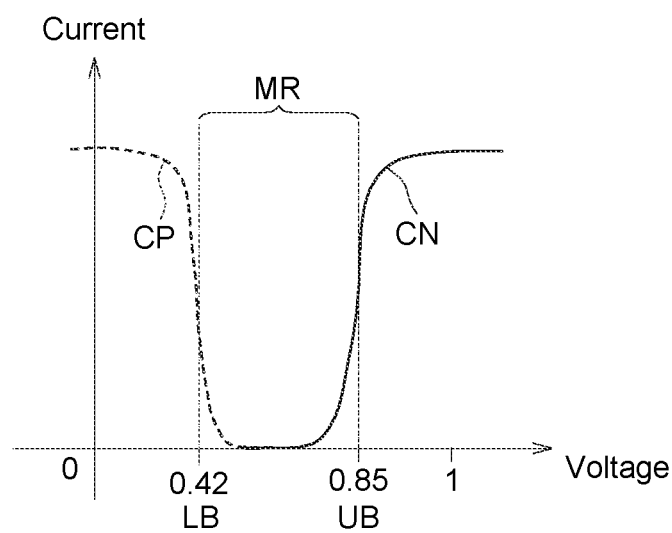

Refer to FIGS. 14 to 16. FIG. 15 and FIG. 16 illustrate several examples of the match ranges MR of the analog CAM cell CL2 according to one embodiment. The match range MR in FIG. 14 is "0.42-0.52", the match range MR in FIG. 15 is "0.42-0.65", and the match range MR in FIG. 16 is "0.42-0.85." That is to say, the match range MR of the analog CAM cell CL2 is tunable. The lower bound LB (shown in FIG. 14) of the match range MR is set through the second floating gate device MSp, and the upper bound UB (shown in FIG. 14) of the match range MR is set through the first floating gate device MSn.

Figures 17, 18:
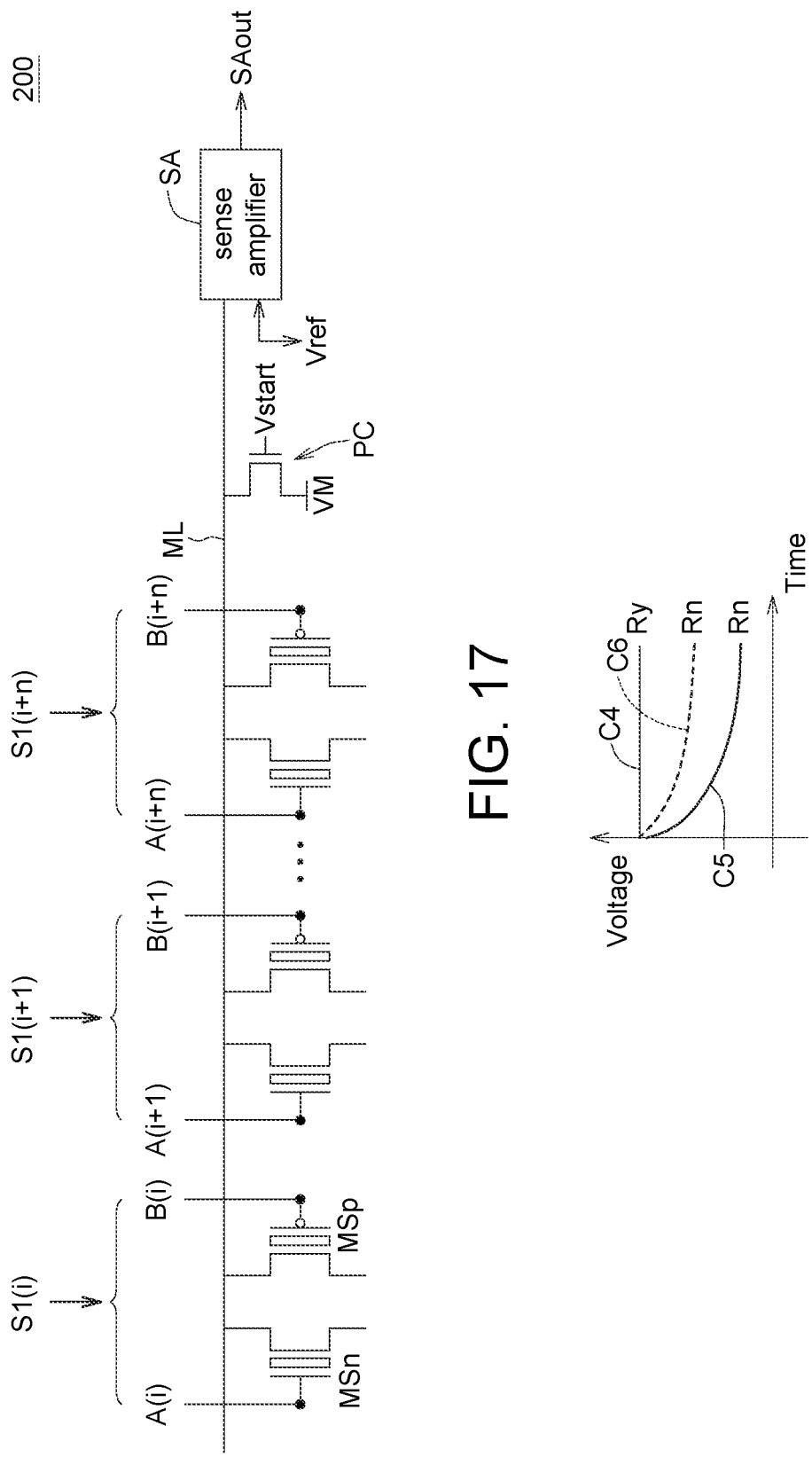
FIG. 17 shows a circuit diagram of an analog CAM according to one embodiment.
FIG. 18 shows voltage curves of the matching line.

Refer to FIG. 17, which shows a circuit diagram of an analog CAM 200 according to one embodiment. The analog CAM 200 may include the matching line ML, a plurality of analog CAM cells CL2, the pre-charge control device PC and the sense amplifier SA. The first floating gate device MSn and the second floating gate device MSp of each of the analog CAM cells CL2 are connected to the matching line ML. The pre-charge control device PC is connected to the matching line ML. The sense amplifier SA is connected to the matching line ML.

In FIG. 17, the i-th inputting signal S1(i) is inputted into the inputting lines A(i) and B(i), the (i+1)-th inputting signal S1(i+1) is inputted into the inputting lines A(i+1) and B(i+1), and the (i+n)-th inputting signal S1(i+n) is inputted into the inputting lines A(i+n) and B(i+n). If the i-th inputting signal S1(i) is within the match range MR of the i-th analog CAM cell CL2, the first floating gate device MSn of the i-th analog CAM cell CL2 is off and the second floating gate device MSp of the i-th analog CAM cell CL2 is off.

Similarly, in FIG. 17, if the (i+1)-th inputting signal S1(i+1) is within the match range MR of the (i+1)-th analog CAM cell CL2, the first floating gate device MSn of the (i+1)-th analog CAM cell CL2 is off and the second floating gate device MSp of the (i+1)-th analog CAM cell CL2 is off. If the (i+n)-th inputting signal S1 (i+n) is within the match range MR of the (i+n)-th analog CAM cell CL2, the first floating gate device MSn of the (i+n)-th analog CAM cell CL2 is off and the second floating gate device MSp of the (i+n)-th analog CAM cell CL1 is off.

If the inputting signals S1(i), S1(i+1), S1(i+n) are respectively within the match range MR of the analog CAM cells CL2, the first floating gate device MSn of the analog CAM cells CL2 are off and the second floating gate device MSp of the analog CAM cells CL2 are off. As such, the voltage of the matching line ML will be kept.

Refer to FIG. 18, which shows voltage curves C4, C5 C6 of the matching line ML. If the inputting signals S1(i), S1(i+1), S1(i+n) fully match the word stored in the analog CAM cells CL2, the voltage of the matching line ML will be kept at the original level, as shown by the voltage curve C4. Then, the sense amplifier SA outputs the match result Ry according to the voltage of the matching line ML.

If all of the inputting signals S1(i), S1(i+1), S1(i+n) do not match the word stored in the analog CAM cells CL2, the voltage of the matching line ML will be greatly pulled down, as shown by the voltage curve C5. Then, the sense amplifier SA outputs the mismatch result Rn according to the voltage of the matching line ML.

In one embodiment, if the inputting signals S1(i), S1(i+1), S1(i+n) partially match the word stored in the analog CAM cells CL2, the voltage of the matching line ML will be slightly pulled down, as shown by the voltage curve C6. The voltage curve C6 is below the original level, so the sense amplifier SA outputs the mismatch result Rn according to the voltage of the matching line ML.

Figure 19:
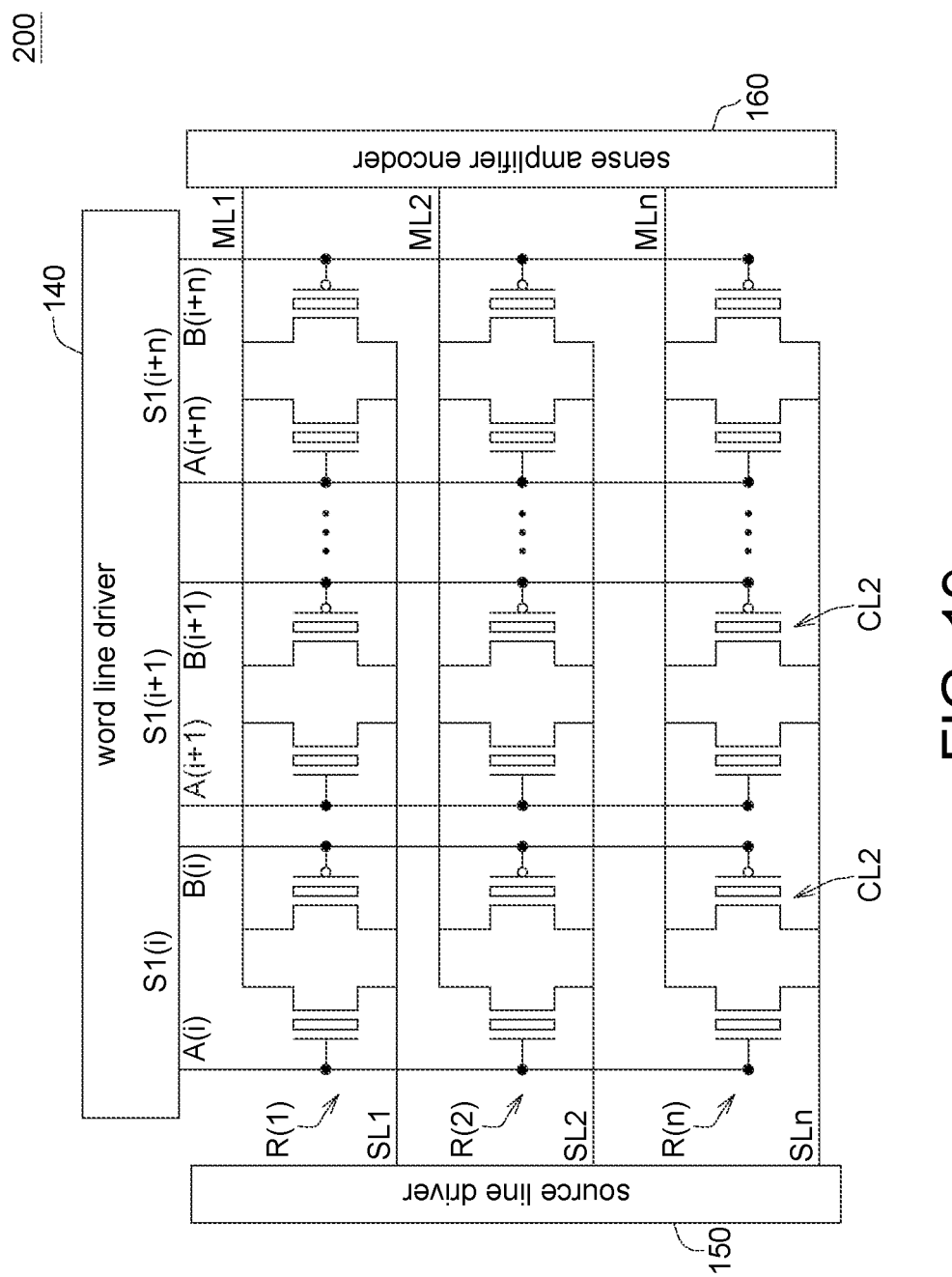
FIG. 19 shows an array structure of the analog CAM in FIG. 17 according to one embodiment.

Refer to FIG. 19, which shows an array structure of the analog CAM 200 according to one embodiment. In the array structure, the analog CAM 200 further includes the word line driver 140 with search buffer, the source line driver 150 and the sense amplifier encoder 160. The inputting lines A(i), B(i), A(i+1), B(i+1), . . . , A(i+n), B(i+n) are connected to the word line driver 140. The source lines SL1, SL2, . . . , SLn are connected to the source line driver 150. The sense amplifier SA is disposed in the sense amplifier encoder 160. The matching lines ML1, ML2, . . . , MLn are connected to the sense amplifier encoder 160.

The analog CAM cells CL12 are arranged in several rows R(1), R(2), . . . , R(n) to store a plurality of different words. The inputting signals S1(i), S1(i+1), S1(i+n) are inputting to the analog CAM cells CL2 respectively. The voltage of the matching line ML1 will be pulled down or be kept depend on whether the inputting signals S1(i), S1(i+1), S1(i+n) match the words stored in the row R(1). Similarly, the voltage of the matching line ML2 will be pulled down or be kept depend on whether the inputting signals S1(i), S1(i+1), S1(i+n) match the words stored in the row R(2), The voltage of the matching line MLn will be pulled down or be kept depend on whether the inputting signals S1(i), S1(i+1), S1(i+n) match the words stored in the row R(n). Then, the sense amplifier encoder 160 obtains which word best matches the inputting signals S1(i), S1(i+1), S1(i+n).

Base on above, the analog CAM 200 may store analog data and any of the analog data matched with the inputting signals S1(i), S1(i+1), S1(i+n) can be found out.

According to the embodiments described above, the first floating gate device MSn and the second floating gate device MSp can be realized by NMOS and PMOS respectively. In another embodiment, the first floating gate device can be realized by any floating gate devices having N type channel, and the second floating gate device can be realized by any floating gate devices having P type channel. Those embodiments are described as follows.

Figure 20:
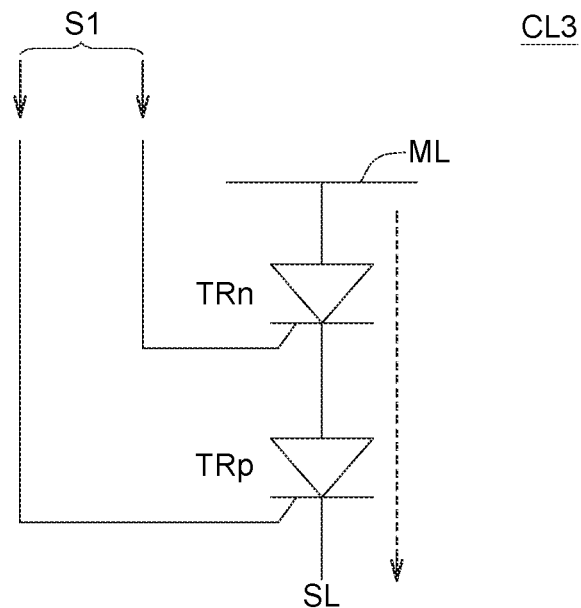
FIG. 20 shows an analog CAM cell according to another embodiment.

Please refer to FIG. 20, which shows an analog CAM cell CL3 according to another embodiment. The analog CAM cell CL3 includes a first floating gate device TRn having a N type channel and a second floating gate device TRp having a P type channel. The second floating gate device TRp is connected to the first floating gate device TRn in series. The first floating gate device TRn is a N channel Thyristor RAM, and the second floating gate device TRp is a P channel Thyristor RAM. An anode of the first floating gate device TRn is connected to the matching line ML, a cathode of the first floating gate device TRn is connected to an anode of the second floating gate device TRp. A cathode of the second floating gate device TRp is connected to the source line SL. The inputting signal S1 is simultaneously inputted into gates of the first floating gate device TRn and the second floating gate device TRp.

Figure 21:
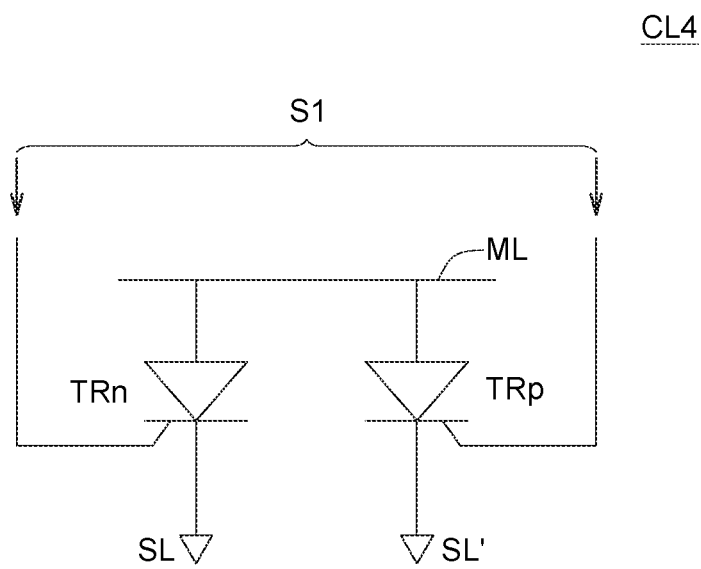
FIG. 21 shows an analog CAM cell according to another embodiment.

Refer to FIG. 21, which shows an analog CAM cell CL4 according to another embodiment. The analog CAM cell CL4 includes the first floating gate device TRn having the N type channel and the second floating gate device TRp having the P type channel. In the analog CAM cell CL4, the second floating gate device TRp is connected to the first floating gate device TRn in parallel. In the analog CAM cell CL4, the anode of the first floating gate device TRn and the anode of the second floating gate device TRp is connected to the matching line ML, the cathode of the first floating gate device TRn and the cathode of the second floating gate device TRp is connected to the source lines SL, SL'. The inputting signal S1 is simultaneously inputted into the gates of the first floating gate device TRn and the second floating gate device TRp.

Figure 22:
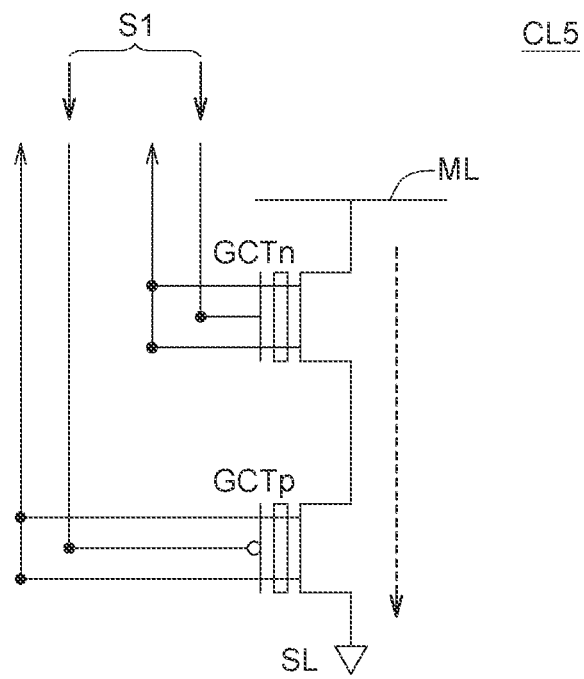
FIG. 22 shows an analog CAM cell according to another embodiment.

Please refer to FIG. 22, which shows an analog CAM cell CL5 according to another embodiment. The analog CAM cell CL5 includes a first floating gate device GCTn having a N type channel and a second floating gate device GCTp having a P type channel. The second floating gate device GCTp is connected to the first floating gate device GCTn in series. The first floating gate device GCTn is a N channel gate control thyristor, and the second floating gate device GCTp is a P channel gate control thyristor. A drain of the first floating gate device GCTn is connected to the matching line ML, a source of the first floating gate device GCTn is connected to a drain of the second floating gate device GCTp. A source of the second floating gate device GCTp is connected to the source line SL, The inputting signal S1 is simultaneously inputted into gates of the first floating gate device GCTn and the second floating gate device GCTp.

Figure 23:
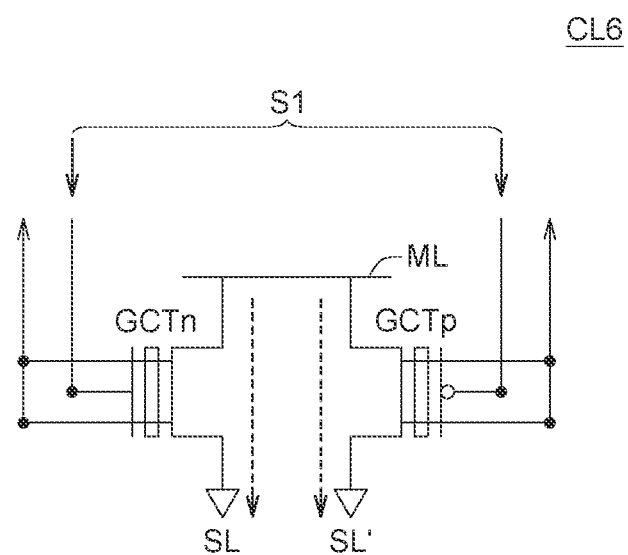
FIG. 23 shows an analog CAM cell according to another embodiment.

Refer to FIG. 23, which shows an analog CAM cell CL6 according to another embodiment. The analog CAM cell CL6 includes the first floating gate device GCTn having the N type channel and the second floating gate device GCTp having the P type channel. In the analog CAM cell CL6 the second floating gate device GCTp is connected to the first floating gate device GCTn in parallel. In the analog CAM cell CL6, the drain of the first floating gate device GCTn and the drain of the second floating gate device GCTp is connected to the matching line ML, the source of the first floating gate device GCTn and the source of the second floating gate device GCTp is connected to the source lines SL, SL'. The inputting signal S1 is simultaneously inputted into the gates of the first floating gate device GCTn and the second floating gate device GCTp.

Base on above, the analog CAM composed of floating gate devices may store analog data and any of the analog data matched with the inputting signals S1 can be found out.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An analog content-address memory (analog CAM), comprising:
    at least one matching line;
    at least one analog CAM cell, each of which includes:
        a first floating gate device having a N type channel, wherein the first floating gate device is connected to the matching line; and
        a second floating gate device having a P type channel, wherein the first floating gate device and the second floating gate device are connected in series, a match range is set through programming the first floating gate device and the second floating gate device, and the first floating gate device and the second floating gate device of the analog CAM cell are configured to receive an inputting signal; and
    at least one sense amplifier, connected to the matching line, wherein if the inputting signal is within the match range, a voltage of the matching line is pulled down to be equal to or lower than a predetermined level and the sense amplifier outputs a match result.

2. The analog CAM according to claim 1, wherein the voltage of the matching line is kept if the inputting signal is not within the match range.

3. The analog CAM according to claim 1, wherein the first floating gate device is a NMOS, and the second floating gate device is a PMOS.

4. The analog CAM according to claim 1, wherein a threshold voltage of the first floating gate device is lower than a threshold voltage of the second floating gate device.

5. The analog CAM according to claim 1, wherein a lower bound of the match range is set through the first floating gate device, and an upper bound of the match range is set through the second floating gate device.

6. The analog CAM according to claim 1, wherein the first floating gate device and the second floating gate device simultaneously receive the inputting signal.

7. The analog CAM according to claim 1, wherein the first floating gate device is a N channel Thyristor RAM, and the second floating gate device is a P channel Thyristor RAM.

8. The analog CAM according to claim 1, wherein the first floating gate device is a N channel gate control thyristor, and the second floating gate device is a P channel gate control thyristor.

9. An analog content-address memory (analog CAM), comprising:
    at least one matching line;
    at least one analog CAM cell, each of which includes:
        a first floating gate device having a N type channel, wherein the first floating gate device is connected to the matching line; and
        a second floating gate device having a P type channel, wherein the first floating gate device and the second floating gate device are connected in parallel, a match range is set through programming the first floating gate device and the second floating gate device, and the first floating gate device and the second floating gate device are configured to receive an inputting signal; and
    at least one sense amplifier, connected to the matching line, wherein, if the inputting signal is within the match range, a voltage of the matching line is kept at an original level and the sense amplifier outputs a match result.

10. The analog CAM according to claim 9, wherein the voltage of the matching line is pulled down if the inputting signal is not within the match range.

11. The analog CAM according to claim 9, wherein the first floating gate device is a NMOS, and the second floating gate device is a PMOS.

12. The analog CAM according to claim 9, wherein a threshold voltage of the first floating gate device is higher than a threshold voltage of the second floating gate device.

13. The analog CAM according to claim 9, wherein a lower bound of the match range is set through the second floating gate device, and an upper bound of the match range is set through the first floating gate device.

14. The analog CAM according to claim 9, wherein the first floating gate device and the second floating gate device simultaneously receive the inputting signal.

15. The analog CAM according to claim 9, wherein the first floating gate device is a N channel Thyristor RAM, and the second floating gate device is a P channel Thyristor RAM.

16. The analog CAM according to claim 9, wherein the first floating gate device is a N channel gate control thyristor, and the second floating gate device is a P channel gate control thyristor.

17. An operation method of an analog content-address memory (analog CAM), comprising:
  programing a first floating gate device having a N type channel; and
  programing a second floating gate device having a P type channel, wherein the second floating gate device is connected to the first floating gate device in series or in parallel, a match range is set after programming the first floating gate device and the second floating gate device.

18. The operation method of the analog CAM according to claim 17, wherein the first floating gate device and the second floating gate device are programmed by Fowler—Nordheim (FN) tunneling or Channel Hot Electron (CHE) programming.

19. The operation method of the analog CAM according to claim 17, further comprising:
  inputting an inputting signal into the first floating gate device and the second floating gate device; and
  outputting a match result or a mismatch result according to a voltage of a matching line connected to the first floating gate device and the second floating gate device.

20. The operation method of the analog CAM according to claim 17, wherein the inputting signal is simultaneously inputted into the first floating gate device and the second floating gate device.

* * * * *